(12) United States Patent
Allan

(10) Patent No.: US 7,167,020 B2
(45) Date of Patent: Jan. 23, 2007

(54) APPARATUS AND METHOD OF TUNING A DIGITALLY CONTROLLED INPUT/OUTPUT DRIVER

(75) Inventor: Scott Paul Allan, Fort Collins, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 113 days.

(21) Appl. No.: 11/038,732

(22) Filed: Jan. 20, 2005

(65) Prior Publication Data
US 2006/0158213 A1 Jul. 20, 2006

(51) Int. Cl.
H03K 19/003 (2006.01)

(52) U.S. Cl. .............. 326/30; 326/33; 326/34; 326/87

(58) Field of Classification Search ........... 326/30–34, 326/87
See application file for complete search history.

(56) References Cited

U.S. PATENT DOCUMENTS

| | | | |
|---|---|---|---|
| 4,975,598 A | 12/1990 | Borkar | |
| 5,694,073 A | 12/1997 | Coots et al. | |
| 6,057,710 A | 5/2000 | Singh | |
| 6,064,230 A | 5/2000 | Singh | |
| 6,262,606 B1 | 7/2001 | Tamjidi | |
| 6,650,170 B1 | 11/2003 | Uzelac | |
| 6,772,351 B1 | 8/2004 | Werner et al. | |
| 7,038,486 B2 * | 5/2006 | Aoyama et al. | 326/30 |
| 2002/0091948 A1 | 7/2002 | Werner et al. | |
| 2004/0113654 A1 * | 6/2004 | Lundberg | 326/30 |

* cited by examiner

Primary Examiner—Anh Q. Tran

(57) ABSTRACT

Apparatus and method of tuning a digitally controlled input/output (I/O) driver of an integrated circuit for parameter variation compensation, a bus impedance of the I/O driver being controlled by a first digital code comprises in one embodiment: controlling a bus impedance of a reference I/O driver network by a second digital code; monitoring a voltage potential of the bus and generating the second digital code based on the monitored bus voltage potential; and tuning the second digital code to generate the first digital code.

23 Claims, 2 Drawing Sheets (BACKGROUND)

APPARATUS AND METHOD OF TUNING A DIGITALLY CONTROLLED INPUT/OUTPUT DRIVER

BACKGROUND

For many of today's high speed input/output (I/O) interfaces for integrated circuits, large variations of I/O drive (or termination) strength result principally from variations in IC parameters, like variations in processing, voltage, and temperature (PVT variations), for example. Consequently, many integrated circuit I/O designs have incorporated PVT variation compensation circuits in the I/O drivers to factor out these variations. This results in output drive or termination strength varying by only a few percent rather than the approximately 50 percent variation that may occur ordinarily without such compensation.

There are numerous PVT variation compensation methods which may be implemented in the driver circuits of the I/O interface, either with analog control or with digital control. In either of these implementations, some number of external resistors are employed to give a current or voltage drive strength reference(s). Digital control implementations have gained popularity for their relatively simple and effective designs.

FIG. 1 is a block diagram schematic of a typical digital implementation of a pull-up portion of a PVT variation compensation circuit for use in compensating a digitally controlled integrated circuit (IC) I/O driver using a parallel combination of p-type field effect transistors (PFETs). In the implementation of FIG. 1, one or more external resistors R of the desired drive or termination impedance may be disposed on a printed circuit board (PCB) 4 and connected between a pin P, which is referred to as the IC PVT pin, of the integrated circuit 6 (enclosed by dashed lines) and ground GND 8.

A reference network of digitally controlled parallel PFETs 10 may be connected internal to the IC from the IC PVT pin P to an IC voltage supply Vdd. Generally, the number of PFETs in the reference network 10 is commensurate with the PFETs of the corresponding I/O driver, shown by block 11, which may be controlled by the same digital control lines 12. However, any number of PFETs may be used for the reference network 10 with more PFETs giving greater precision. In the present embodiment, when a control line is set to binary "1", the corresponding PFET is "on" and driving and when set to a binary "0", the corresponding PFET is "off" and not driving. In this manner, the strongest drive or termination strength would be controlled by the 5-bit digital control lines 12 set as a binary number "11111" (i.e. strength 2N−1). Accordingly, the reference network 10 would provide no drive when the lines 12 were set to the binary number "00000" (i.e. all PFETs turned off and not driving).

For example, for a 5-bit digital compensation implementation, the PFETs of the reference network 10 would be sized from the most significant bit (MSB) PFET to the least significant bit (LSB) PFET with strengths "N", "N/2", "N/4", "N/8", and "N/16", respectively, N being related to the actual drive (or termination) strength or impedance of the PFET network. So, if it is desired to have a network drive impedance of 10 ohms, for example, when the binary code is "11111", the PFET strengths or impedances of the network, i.e. "N", "N/2", "N/4", "N/8", and "N/16", are chosen accordingly. Likewise, if the PFET network impedance was chosen to be 50 ohms at a binary code of "11111", then N would be set differently.

Included in the implementation is a comparator 14 with one input (+) coupled to the IC PVT pin P and another input (−) coupled a reference voltage. The voltage at the IC PVT pin P provides a measure of the drive strength of the corresponding I/O driver. In the present example, the reference voltage is generated on the IC by a resistor divider network of two resistors R2 of the same value coupled between the voltage supply Vdd and ground 13. The node of the divider network, which is at Vdd/2, is coupled to the (−) input of the comparator 14 which compares the voltage at the IC PVT pin P to the internally generated reference voltage Vdd/2. Coupled to the output of comparator 14 is binary counter logic 16 which may include an up/down counter 18 to produce the digital binary setting of lines 12.

In operation, if the voltage at the IC PVT pin P increases above the reference voltage Vdd/2, the comparator 14 results in a comparison state to control the up/down counter 18 in the PVT counter logic 16 to count down (i.e. the drive strength is becoming too strong). Similarly, if the voltage at the IC PVT pin P decreases below the reference voltage Vdd/2, the comparator 14 results in a comparison state to control the up/down counter 18 in the PVT counter logic 16 to count up (i.e. the drive strength is becoming too weak). In the present example, the up/down counter 18 may be controlled to count up or down by a sampling of the state of the output of comparator 14. Since, the "time constant" of temperature and voltage changes is relatively long, the sampling frequency the counter operates at may be set generally at some frequency lower than normal functional clocks of the IC. However, it is understood that more sophisticated "filter" circuits may be designed into the logic 16 such that some number of consecutive "count down" or "count up" samples of the output of comparator 14 would be filtered to actually change the counter 18.

The corresponding I/O driver may use the identical number of parallel PFETs as the reference network 10. That way, whatever binary code over lines 12 that resulted from a voltage comparison between the reference Vdd/2 and the voltage at the PVT pin P would also produce the proper impedance for each I/O driver. Of course, the digital control for the PFETs in the corresponding I/O driver may be further qualified with a functional control that determines whether a "1" or "0" should be driven. The sampling of the comparison result of comparator 14 may be performed periodically as noted above, and the drive strength of the I/O driver updated over lines 12 periodically as a result.

A drawback of the foregoing described implementation is that it provides one, and only one, operating point as determined by the chosen value of the external resistance R. Accordingly, the operating point cannot be further tuned for operational variations, such as bus loading, for example.

SUMMARY

In accordance with one aspect of the present invention, a method of tuning a digitally controlled input/output (I/O) driver of an integrated circuit for parameter variation compensation, a bus impedance of the I/O driver being controlled by a first digital code, the method comprising the steps of: controlling a bus impedance of a reference I/O driver network by a second digital code; monitoring a voltage potential of the bus and generating the second digital code based on the monitored bus voltage potential; and tuning the second digital code to generate the first digital code.

DETAILED DESCRIPTION

Disclosed are apparatus and method of tuning the operating point of a PVT variation compensation circuit for digitally controlling an I/O driver of an integrated circuit. The output drive strength and/or the termination strength of the I/O driver may be digitally controlled. For example, an I/O driver circuit interface to a bus may include both FET network driver circuits, which may be set at a low impedance of 20 ohms, for example, and/or FET network destination or termination circuits, which may be set at approximately 50 ohms, for example. For the termination circuits, PFET pull-up and NFET pull-down networks may be each set at approximately 100 ohms to achieve the 50 ohm termination impedance to Vdd/2, for example. Fundamentally, the termination circuits may be no different from the driver circuits other than having a different impedance. Accordingly, when an I/O driver circuit is driving the bus, the PFET network driver circuits are "on" and being digitally controlled, and likewise, when the I/O driver circuit is receiving from the bus, the FET network termination circuits are "on" and being digitally controlled.

In one embodiment of the present invention, the output digital code is intercepted and modified or tuned before it goes to the corresponding FET network of the I/O driver circuit. This embodiment may add more flexibility in control by providing a number of different operational functions including:

(1) Forcing the output digital code to a particular value. (This function may defeat or circumvent the purpose of the PVT variation compensation control, but is a useful workaround should the PVT control circuit be inoperable due to a defect.);

(2) Adjusting the pull-up PFET strength relative to the pull-down NFET strength even if a shared IC PVT control pin is used. (i.e. normally a shared IC PVT control pin results in identical pull-up and pull-down strength, rather than having individual control with dedicated pull-up and pull-down PVT control pins— this will become better understood from the description found herein below);

(3) Adjusting the drive strength for different loading conditions on the bus being driven by the I/O driver;

(4) Adjusting the drive strength for different operating modes on the bus (for example, an AGP device might support both AGP 2.0 and AGP 3.0 electrical signaling, yet might want slightly different output impedance in each case.); and (5) Adjusting the drive strength to allow electrical margining to be performed in a more automated fashion (i.e. no resistors need to be changed on the PC board).

Figure 1:
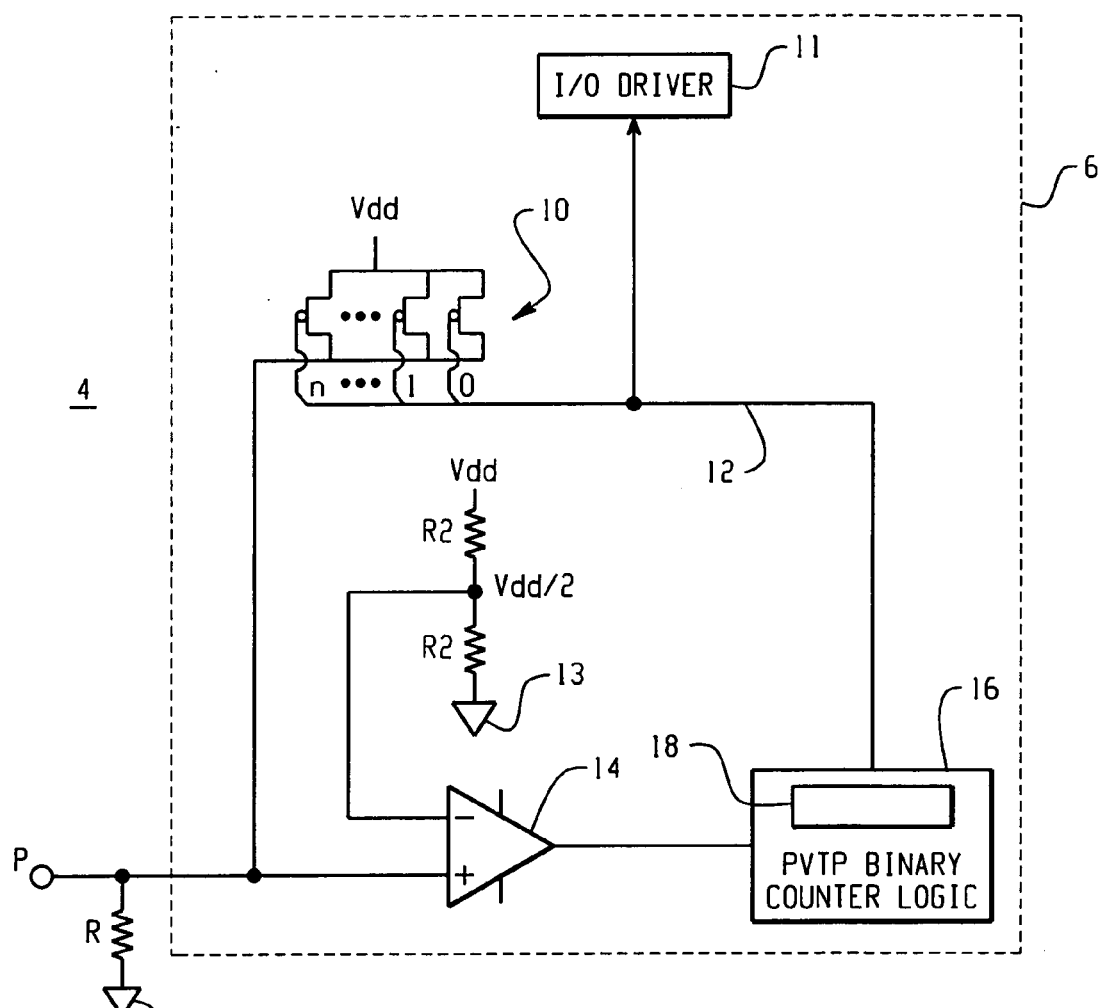
FIG. 1 is a block diagram schematic of an exemplary digital implementation of a pull-up portion of a PVT variation compensation circuit for use in compensating a digitally controlled integrated circuit (IC) I/O driver.
Figure 2:
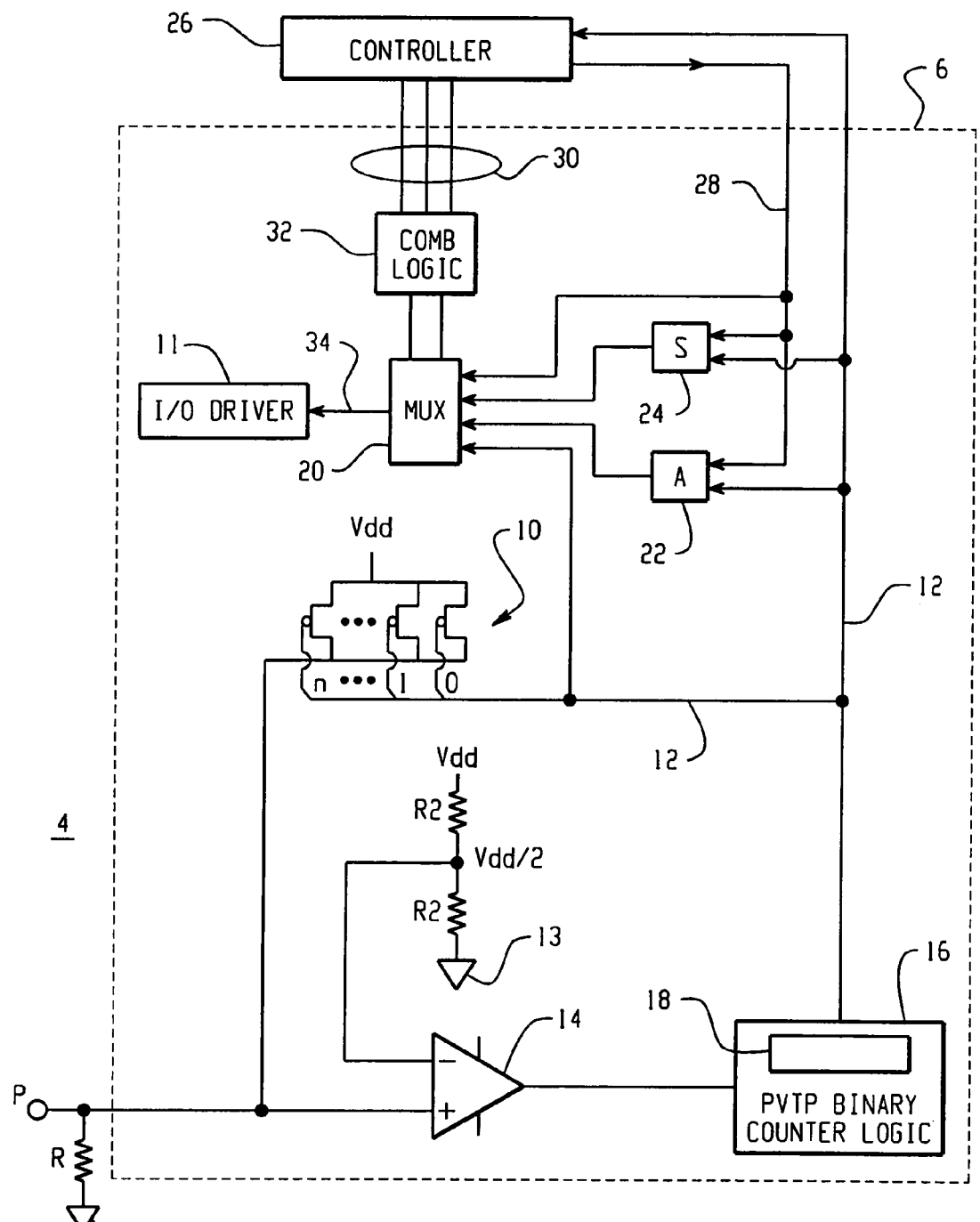
FIG. 2 is a block diagram schematic of exemplary apparatus for tuning the digitally controlled I/O driver for PVT variation compensation suitable for embodying one aspect of the present invention.

FIG. 2 is a block diagram schematic of exemplary apparatus for tuning the digitally controlled I/O driver for PVT variation compensation suitable for embodying one aspect of the present invention. Since the embodiment of FIG. 2 includes many of the same or similar components described in connection with the embodiment of FIG. 1, such components will not be described again for FIG. 2 and will retain the same reference numerals as used in FIG. 1. Referring to FIG. 2, the digital control lines 12, produced by the closed-loop control of elements 10–18 as described supra, are coupled directly to (1) one input of a multiplexer circuit 20 which may be a four-to-one (4:1) multiplexer, for example; (2) one input of a digital adder circuit 22; (3) one input of a digital subtractor circuit 24; and digital inputs of a programmed controller 26, which may be a microprocessor based controller, for example.

A data bus 28 may be coupled from digital outputs of the controller 26 to: (1) a second input of the multiplexer circuit 20; (2) a second input of the subtractor circuit 24; and (3) a second input of the adder circuit 22. Digital outputs of the adder 22 and subtractor 24 are coupled to respective third and fourth inputs of the multiplexer circuit 20. Address lines 30 may be coupled from digital outputs of the controller 26 to selection inputs of the multiplexer circuit 20. In some instances, combinational logic 32 may be included to decode the digital code of the address lines 30 to accommodate the selection code of the multiplexer circuit 20.

Because the digital code of the control lines 12 is ordinarily a binary number, the adder circuit 22 may add a binary number to or the subtractor circuit 24 may subtract a binary number from the binary code of the control lines 12 to adjust or further tune the drive (or termination) strength of the I/O driver. For a typical 5-bit digital binary code, the normal range of operation might be in a binary code range from 10000 to 11110. This would correspond to a drive (or termination) strength from 16 to 30. A ratio of slightly less than 2:1 is typically needed to accommodate changes in process, voltage, and temperature. With a drive (or termiantion) strength of 16, there is a 6% error since the digital code may vary between 15, 16, and 17 as it is trying to maintain a consistent strength. If the 6% error is too much, 6-bit or 7-bit control lines may be used instead. In the present embodiment, the adder and subtractor circuits 22 and 24, respectively, are designed to be saturating (i.e. not roll over). Accordingly, if too great a binary number is added, the result or output of the adder circuit 22 will "stick" at "11111", and if too large a number is subtracted, the result or output of the subtractor 24 will "stick" at "00000".

The controller 26 may be programmed with an appropriate algorithm in software, firmware or hardware for tuning the output digital code which drives the corresponding FET network of the I/O driver of the IC. The present embodiment retains much of the accuracy of the PVT variation compensation circuit described in connection with FIG. 1, while adding an operating point tunability aspect. However, only small amounts of tuning are realistic without resulting in too much error. If a binary "1" is added to the binary code over lines 12 in the adder circuit 22 to increase drive strength, the amount that the drive strength is increased is 6% if the binary code over lines 12 is 16, but only 3% if the binary code is 30. Much of this error effect can be minimized by having the output digital code readable, periodically or otherwise, by the programmed controller 26 which may modify or tune accordingly the amount of adjustment that is being made by the counter logic 16. For instance, if a 6% increase in drive strength were desired, "1" would be added to the output digital code of 16, whereas "2" would be added to an output digital code of 30. A similar tuning may occur for the termination strength of the I/O driver.

More specifically, the closed-loop circuit elements 10–18 of the embodiment of FIG. 2 are intended to operate in a similar manner as described herein above for the embodiment of FIG. 1 for PVT variation compensation. Thus, the output digital code over lines 12 will change from one sampling of the status of comparator 14 to another. The output digital code over lines 12 may be read by the programmed controller 26 and the change thereof determined. If the change is within a desired range for PVT variation compensation, for example, then the controller 26 may control the multiplexer circuit 20 via lines 30 and logic 32, if implemented, to select the digital code of the control lines 12 to be directly coupled over the output lines 34 to drive the network pull-up PFETs (or pull-down NFETs) of the I/O driver.

If the change determined by the controller 26 is not within the desired range, then the controller 26, through an appropriate algorithm, may further tune the digital code of lines 12 by adding to or subtracting from it using the adder circuit 22 or subtractor circuit 24, respectively. For example, suppose the controller 26 determined to tune the output digital code over lines 12 by addition, then it may output the desired addition amount in binary code over data bus 28 to adder 22 wherein the binary codes of lines 12 and 28 are added. Then, the controller 26 may control the multiplexer circuit 20 to select the resultant output of adder circuit 22 to be coupled over the output lines 34 to drive the network pull-up PFETs (or pull-down NFETs) of the I/O driver.

Likewise, suppose the controller 26 determined to tune the output digital code over lines 12 by subtraction, then it may output the desired subtraction amount in binary code over data bus 28 to subtractor 24 wherein the binary codes of lines 12 and 28 are subtracted. Then, the controller 26 may control the multiplexer circuit 20 to select the resultant output of subtractor circuit 24 to be coupled over the output lines 34 to drive the network pull-up PFETs of the I/O driver. The foregoing described operations may occur also for the pull-down NFETs of the I/O driver in a similar pull-down compensation tuning embodiment.

Moreover, in the present embodiment, the controller 26 may circumvent the PVT variation compensation loop of elements 10–18 and output a digital control code of its own derivation over the data bus 28. This circumvention may occur if the controller 26 determines that the loop is not functioning properly and override its function. In this override mode, the controller 26 controls the multiplexer circuit 20 to select the control code of the data bus 28 to be directly coupled over the output lines 34 to drive the network pull-up PFETs (and pull-down NFETs) of the I/O driver. In this configuration, an algorithm of the programmed controller 26 will establish the desired drive (or termination) strength of the I/O driver in lieu of the closed-loop control of elements 10.

Electrical margining of a system is a step to applying operating point tuning of the digital code for controlling I/O driver (or termination) strength. Empirical experiments may be performed under various bus loading conditions, or with various device types, to determine certain optimal operating points. The convenience of tuning under control of a programmed controller makes such experiments much easier to conduct. The outcome may be a combination of hardware changes to the typical "operating point" or actual external resistance values chosen to set the normal operating point, as well as to provide data that could potentially be used in any further tuning algorithms for the programmed controller 26.

There is no single "algorithm" to use for operating point tuning applications of the programmed controller 26. Each individual application has different kinds of information that may be available upon which to make decisions. In fact, one of the advantages of this embodiment is that it need not rely on programming the controller 26 with a particular algorithm for tuning or updating the output digital code. The embodiment of FIG. 2 rather provides the circuitry to accommodate the use of a controller 26 programmed with one or more algorithms for tuning the digitally controlled output driver for desired PVT compensation.

For a multi-slot bus such as PCI, "card present" information may be made available to use for decision making. A table of information derived during electrical characterization can be applied to the observed slot occupancy to choose the proper adjustment to the digital control code values. For a point-to-point bus such as AGP, device ID information can be read using a lower-speed configuration cycle mechanism. Based upon the ID of the device, and earlier electrical characterization data, a desired operating point for that particular device can be selected.

In some cases, a more sophisticated algorithm may be found desirable. In an application that could do electrical margining as part of initial system wakeup, real-time margining and data gathering could be done to chose an optimal operating point. If frequency could be varied, and pass/fail testing could be run on the bus, then the PVT variation compensation control code settings could be modified in the algorithm in steps, and a "box" of passing operating points could be obtained. The center of the "box" would then be selected as the operating point.

While the above described embodiment of FIG. 2 is intended only for compensating the pull-up portion of the I/O driver, it is to be understood that a symmetric or mirror circuit using a reference network of NFETs coupled to a negative voltage supply −Vdd may be used for compensating the pull-down portion of the I/O driver. A combined implementation of a compensation circuit for the pull-up and pull-down I/O drivers may include an IC PVT pin P for the reference network of NFETs, and another IC PVT pin for the reference network of PFETs. But, this combined PVT variation compensation circuit will need additional IC pins. Conversely, a single IC PVT pin P could be used with just a slight modification to the logic in the compensation comparison network. The use of a single IC PVT pin will save valuable package pins when all of the I/O drivers of the IC are taken into consideration.

However, a shared IC PVT control pin generally results in identical pull-up and pull-down strengths. Typically, to achieve separate digital control over the network of PFETs versus the network of NFETs of each I/O driver of the IC, the use of 2 IC PVT pins for each I/O driver was generally needed. The present embodiment of FIG. 2 overcomes this restriction by accommodating independent tuning or adjustment of the pull-up PFET strength relative to the pull-down NFET strength even if a shared IC PVT control pin is used.

While the present invention has been described herein above in connection with one or more embodiments, it is understood that such embodiments were provided merely by way of example with no intent of limiting the invention in any way. Accordingly, the present invention should not be limited by the various embodiments, but rather construed in breadth and broad scope in accordance with the recitation of the claims appended hereto.

What is claimed is:

1. Apparatus for tuning a digitally controlled input/output (I/O) driver of an integrated circuit for parameter variation compensation, said I/O driver including a first switching network coupled between a bus and a fixed voltage potential, the impedance of said first switching network being controlled by a first digital code, said apparatus comprising:
- a second switching network coupled between a desired impedance and said fixed voltage potential, the impedance of said second switching network being controlled by a second digital code;
- a first control circuit coupled to said second switching circuit and said desired impedance for monitoring a voltage potential of said desired impedance and for generating said second digital code based on the monitored voltage potential; and
- a second control circuit coupled to said first control circuit for tuning said second digital code to generate said first digital code, wherein the second control circuit comprises:
- an adder circuit for adding a digital code to said second digital code to generate the first digital code;
- a subtractor circuit for subtracting a digital code from said second digital code to generate the first digital code; and
- a selector circuit for selecting between said adder circuit and said subtractor circuit for tuning the second digital code to generate the first digital code.

2. The apparatus of claim 1 wherein the desired impedance includes a fixed resistance coupled between a pin of the integrated circuit and a second voltage potential.

3. The apparatus of claim 1 wherein the second control circuit includes a circuit for circumventing the tuning of the second digital code and setting the first digital code to the second digital code.

4. The apparatus of claim 1 wherein the second control circuit includes a circuit for circumventing the tuning of the second digital code and setting the first digital code to a digital code generated independent of the second digital code.

5. The apparatus of claim 1 wherein the second control circuit comprises a programmed controller operative to determine operating bus conditions and to control the tuning of the second digital code to generate the first digital code based on the determined bus operating conditions.

6. The apparatus of claim 1 wherein the second controller is operative to select among: (1) tuning of the second digital code to generate the first digital code; (2) circumventing the tuning of the second digital code and setting the first digital code to the second digital code; and (3) circumventing the tuning of the second digital code and setting the first digital code to a digital code generated independent of the second digital code.

7. The apparatus of claim 1 wherein the first switching network is operative to provide drive impedance to the bus controlled by the first digital code.

8. The apparatus of claim 1 wherein the first switching network is operative to provide termination impedance to the bus controlled by the first digital code.

9. The apparatus of claim 1 wherein the second switching network comprises a parallel combination of field effect transistors.

10. The apparatus of claim 1 wherein the parameter variation comprises integrated circuit processing, voltage and temperature variation.

11. Method of tuning a digitally controlled input/output (I/O) driver of an integrated circuit for parameter variation compensation, a bus impedance of said I/O driver being controlled by a first digital code, said method comprising the steps of:
- controlling a bus impedance of a reference I/O driver network by a second digital code;
- monitoring a voltage potential of a desired impedance and generating said second digital code based on the monitored voltage potential; and
- tuning said second digital code to generate said first digital code, wherein the step of tuning includes the steps of:
- adding a digital code to the second digital code to generate the first digital code;
- subtracting a digital code from the second digital code to generate the first digital code; and
- selecting between the steps of adding and subtracting for tuning the second digital code to generate the first digital code.

12. The method of claim 11 including coupling a fixed termination resistance to a pin of the integrated circuit to form the desired impedance.

13. The method of claim 11 including the steps of circumventing the tuning of the second digital code and setting the first digital code to the second digital code.

14. The method of claim 11 including the step of circumventing the tuning of the second digital code, and setting the first digital code to a digital code generated independent of the second digital code.

15. The method of claim 11 including the steps of determining operating bus conditions, and controlling the tuning of the second digital code to generate the first digital code based on the determined bus operating conditions.

16. The method of claim 11 including the step of selecting among the steps of: (1) tuning of the second digital code to generate the first digital code; (2) circumventing the tuning of the second digital code and setting the first digital code to the second digital code; and (3) circumventing the tuning of the second digital code and setting the first digital code to a digital code generated independent of the second digital code.

17. The method of claim 11 wherein the step of controlling includes controlling a bus drive impedance of the reference I/O driver network by the second digital code.

18. The method of claim 11 wherein the step of controlling includes controlling a bus termination impedance of the reference I/O driver network by the second digital code.

19. The method of claim 11 wherein the parameter variation being compensated comprises integrated circuit processing, voltage and temperature variation.

20. Apparatus for tuning a digitally controlled input/output (I/O) driver of an integrated circuit for parameter variation compensation, said I/O driver including at least one first switching network coupled between a bus and a corresponding voltage potential, the impedance of each first switching network being controlled by a corresponding first digital code, said apparatus comprising:
- a second switching network corresponding to each first switching network, each second switching network coupled between a desired impedance and said corresponding voltage potential, the impedance of each second switching network being controlled by a corresponding second digital code;
- a first control circuit coupled to each second switching circuit and corresponding desired impedance for monitoring a voltage potential of said corresponding desired impedance and for generating said corresponding second digital code based on the monitored voltage potential; and a second control circuit coupled to each first control circuit for tuning said second digital code generated by each first control circuit to generate said corresponding first digital code, wherein each second control circuit comprises:

an adder circuit for adding a digital code to said second digital code to generate the first digital code;

a subtractor circuit for subtracting a digital code from said second digital code to generate the first digital code; and a selector circuit for selecting between said adder circuit and said subtractor circuit for tuning the second digital code to generate the first digital code.

21. Apparatus for tuning a digitally controlled input/output (I/O) driver of an integrated circuit for parameter variation compensation, a bus impedance of said I/O driver being controlled by a first digital code, said apparatus comprising:

means for controlling a bus impedance of a reference I/O driver network by a second digital code;

means for monitoring a voltage potential of a desired impedance and generating said second digital code based on the monitored voltage potential; and means for tuning said second digital code to generate said first digital code, wherein the tuning means includes:

means for adding a digital code to the second digital code to generate the first digital codes;

means for subtracting a digital code from the second digital code to generate the first digital code; and means for selecting between the steps of adding and subtracting for tuning the second digital code to generate the first digital code.

22. Apparatus for tuning a digitally controlled input/output (I/O) driver of an integrated circuit for parameter variation compensation, said I/O driver including a first switching network coupled between a bus and a fixed voltage potential, the impedance of said first switching network being controlled by a first digital code, said apparatus comprising:

a second switching network coupled between a desired impedance and said fixed voltage potential, the impedance of said second switching network being controlled by a second digital code;

a first control circuit coupled to said second switching circuit and said desired impedance for monitoring a voltage potential of said desired impedance and for generating said second digital code based on the monitored voltage potential; and a second control circuit coupled to said first control circuit for tuning said second digital code to generate said first digital code, wherein the second control circuit includes a circuit for circumventing the tuning of the second digital code and setting the first digital code to a digital code generated independent of the second digital code.

23. Method of tuning a digitally controlled input/output (I/O) driver of an integrated circuit for parameter variation compensation, a bus impedance of said I/O driver being controlled by a first digital code, said method comprising the steps of:

controlling a bus impedance of a reference I/O driver network by a second digital code;

monitoring a voltage potential of a desired impedance and generating said second digital code based on the monitored voltage potential;

tuning said second digital code to generate said first digital code; and selectively circumventing the tuning of the second digital code, and setting the first digital code to a digital code generated independent of the second digital code.

* * * * *

UNITED STATES PATENT AND TRADEMARK OFFICE
CERTIFICATE OF CORRECTION

PATENT NO. : 7,167,020 B2  Page 1 of 1
APPLICATION NO. : 11/038732
DATED : January 23, 2007
INVENTOR(S) : Scott Paul Allan It is certified that error appears in the above-identified patent and that said Letters Patent is hereby corrected as shown below:

In column 9, line 27, in Claim 21, delete "codes;" and insert -- code; --, therefor.

Signed and Sealed this

Eighteenth Day of November, 2008

JON W. DUDAS
*Director of the United States Patent and Trademark Office*